(12) United States Patent
Peter et al.

(10) Patent No.: US 10,741,405 B2
(45) Date of Patent: *Aug. 11, 2020

(54) SELECTIVE SELF-ALIGNED PATTERNING OF SILICON GERMANIUM, GERMANIUM AND TYPE III/V MATERIALS USING A SULFUR-CONTAINING MASK

(71) Applicant: Lam Research Corporation, Fremont, CA (US)

(72) Inventors: Daniel Peter, Campbell, CA (US); Samantha Tan, Fremont, CA (US); Reza Arghavani, Scotts Valley, CA (US); Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 20 days.

This patent is subject to a terminal disclaimer.

(21) Appl. No.: 16/053,978

(22) Filed: Aug. 3, 2018

(65) Prior Publication Data
US 2018/0342399 A1    Nov. 29, 2018

Related U.S. Application Data

(63) Continuation of application No. 15/377,359, filed on Dec. 13, 2016, now Pat. No. 10,043,672.

(Continued)

(51) Int. Cl.
    *H01L 21/306*     (2006.01)
    *H01L 21/308*     (2006.01)
(Continued)

(52) U.S. Cl.
CPC .. *H01L 21/30604* (2013.01); *H01L 21/02057* (2013.01); *H01L 21/306* (2013.01);
(Continued)

(58) Field of Classification Search
CPC ............ H01L 21/02057; H01L 21/306; H01L 21/30604; H01L 21/3081; H01L 21/3085; H01L 21/31058; H01L 21/31111
(Continued)

(56) References Cited

U.S. PATENT DOCUMENTS 7,560,361 B2 *   7/2009   Frank ................ H01L 21/76254
                                                                      257/411
9,105,661 B2 *   8/2015   Huang ................... H01L 29/785
(Continued)

OTHER PUBLICATIONS

Lauren Peckler, Stacy Heslop, and Anthony J. Muscat. "SiGe$_x$ (100) (x=0.25, 0.5, 0.75) and Ge (100) MOSCaps with Aqueous Ammonium Sulfide Passivation". AVS New Mexico 2016; 2 pages.
(Continued)

*Primary Examiner* — Lan Vinh

(57) ABSTRACT

A method for patterning a substrate including multiple layers using a sulfur-based mask includes providing a substrate including a first layer and a second layer arranged on the first layer. The first layer includes a material selected from a group consisting of germanium, silicon germanium and type III/V materials. The method includes depositing a mask layer including sulfur species on sidewalls of the first layer and the second layer by exposing the substrate to a first wet chemistry. The method includes removing the mask layer on the sidewalls of the second layer while not completely removing the mask layer on the sidewalls of the first layer by exposing the substrate to a second wet chemistry. The method includes selectively etching the second layer relative to the first layer and the mask layer on the sidewalls of the first layer by exposing the substrate to a third wet chemistry.

26 Claims, 3 Drawing Sheets

Related U.S. Application Data

(60) Provisional application No. 62/314,685, filed on Mar. 29, 2016.

(51) Int. Cl.
*H01L 21/02* (2006.01)
*H01L 21/311* (2006.01)
*H01L 21/3105* (2006.01)

(52) U.S. Cl.
CPC ...... *H01L 21/3081* (2013.01); *H01L 21/3085* (2013.01); *H01L 21/31058* (2013.01); *H01L 21/31111* (2013.01)

(58) Field of Classification Search
USPC ....... 438/745, 748, 753, 757, 754, 758, 769, 438/778
See application file for complete search history.

(56) References Cited

U.S. PATENT DOCUMENTS

| | | | | |
|---|---|---|---|---|
| 10,043,672 | B2* | 8/2018 | Peter | H01L 21/02057 |
| 2012/0205741 | A1* | 8/2012 | Levy | H01L 27/1203 |
| | | | | 257/347 |
| 2012/0205747 | A1 | 8/2012 | Yamada et al. | |
| 2013/0341685 | A1* | 12/2013 | Chou | H01L 29/6653 |
| | | | | 257/288 |
| 2015/0344825 | A1* | 12/2015 | Cooper | C11D 3/0073 |
| | | | | 510/175 |

OTHER PUBLICATIONS

Stacy Heslop and Anthony J. Muscat. "Passivation of SiGe Surfaces with Aquenous Ammonium Sulfide". AVS New Mexico 2016; 1 page.

Tobin Kaufman-Osborn, Evgueni A. Chagarov, Sang Wook Park, Bhagawan Sahu, Shariq Siddiqui, Andrew C. Kummel. "Atomic imaging and modeling of passivation, functionalization, and atomic layer deposition nucleation of the SiGe(001) surface via $H_2O_2(g)$ and trimethylaluminum dosing". Surface Science, vol. 630, Dec. 2014; http://www.sciencedirect.com/science/article/pii/S0039602814002544; pp. 273-279.

Yissel Contreras, Pablo Mancheno-Posso, Anthony J. Muscat. "Chemical Passivation of III-V Semiconductors Using Alkanethiolate Layers". University of Arizona, Tucson, Arizona. 2016 MRS Spring Meeting & Exhibit, Phoenix, Arizona; Mar. 29, 2016; 17 pages.

Zhonghao Zhang, Stacy L. Heslop, and Anthony J. Muscat. "A Comparison of Sulfur-Based Chemistries to Passivate the (100) Surfaces of SiGe 25% and 75%". Surface Preparation and Cleaning Conference (SPCC) 2016; Apr. 20, 2016; Department of Chemical and Environmental Engineering; University of Arizona, Tucson, Arizona 85721; 2 pages.

* cited by examiner

SELECTIVE SELF-ALIGNED PATTERNING OF SILICON GERMANIUM, GERMANIUM AND TYPE III/V MATERIALS USING A SULFUR-CONTAINING MASK

CROSS-REFERENCE TO RELATED APPLICATIONS

The present disclosure is a continuation of U.S. patent application Ser. No. 15/377,359 filed on Dec. 13, 2016 (now U.S. Pat. No. 10,043,675), which claims the benefit of U.S. Provisional Application No. 62/314,685, filed on Mar. 29, 2016. The entire disclosures of the applications referenced above are incorporated herein by reference.

FIELD

The present disclosure relates to substrate processing systems, and more particularly to patterning of film in substrate processing systems.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Further scaling of transistors will require materials to replace silicon (Si) in transistor channels. For example, use of germanium (Ge) and silicon germanium (SiGe) film and films including type III/V materials such as gallium (Ga), arsenic (As) and indium (In) have been proposed for future generations of transistors. Material selective pattering of these advanced materials beyond 7 nm node is challenging. These materials have a very low chemical resistance especially to oxidation. Oxides of these materials are usually water soluble, which poses additional challenges for wet chemical approaches.

For example, Ge/SiGe nanowires may be used in some applications. The SiGe film (typically with 50-75% Ge) needs to be etched selectively relative to the Ge film. However, the Ge film has a much lower chemical resistance towards oxidizing solutions than the SiGe film. Traditional wet chemistries are based on oxidizing and dissolution steps. Therefore, the oxidation step poses a significant limitation since the Ge film is etched significantly faster than the SiGe film.

SUMMARY

A method for patterning a substrate including multiple layers using a sulfur-based mask includes a) providing a substrate including a first layer and a second layer arranged on the first layer. The first layer includes a material selected from a group consisting of germanium, silicon germanium and type III/V materials. The method includes b) depositing a mask layer including sulfur species on sidewalls of the first layer and the second layer by exposing the substrate to a first wet chemistry; c) removing the mask layer on the sidewalls of the second layer while not removing the mask layer on the sidewalls of the first layer by exposing the substrate to a second wet chemistry; and d) selectively etching the second layer relative to the first layer and the mask layer on the sidewalls of the first layer by exposing the substrate to a third wet chemistry.

In other features, the method includes repeating b), c) and d) one or more times. The method includes e) performing a clean process prior to b). The clean process includes exposing the substrate to a mixture including deionized water (DIW), aqueous hydrochloric acid (HCl) and aqueous hydrogen peroxide ($H_2O_2$) at a predetermined temperature for a predetermined period. The clean process includes exposing the substrate to dilute hydrofluoric acid (HF).

In other features, the method includes f) enhancing a surface of the substrate by exposing the substrate to a fourth wet chemistry to increase bonding of the mask layer before b). The method includes repeating f), b), c) and d) one or more times.

In other features, exposing the substrate to the fourth wet chemistry includes exposing the substrate to chemistry selected from a group consisting of dilute hydrogen chloride (HCl), dilute hydrogen bromide (HBr), dilute hydrogen iodide (HI), and combinations thereof.

In other features, exposing the substrate to the first wet chemistry includes exposing the substrate to chemistry selected from a group including ammonium sulfide $(NH_4)_2S$, elemental sulfur (S), alkane-thiols, and combinations thereof.

In other features, exposing the substrate to the second wet chemistry includes exposing the substrate to chemistry selected from a group including a mixture of hydrofluoric acid (HF) and hydrogen peroxide ($H_2O_2$), ammonia ($NH_3$), potassium hydroxide (KOH), tetramethylammonium hydroxide (TMAH), tetraethylammonium hydroxide (TEAH), chlorine, sodium peroxide ($Na_2O_2$), sodium hypochlorite (NaClO), ozone ($O_3$), potassium cyanide (KCN), a mixture of potassium hydroxide (KOH), potassium ferricyanide $K_3Fe(CN)_6$ and water ($H_2O$), a mixture of hydrofluoric acid and nitric acid ($HF/HNO_3$), a mixture of citric acid and $H_2O_2$, a mixture of $HF/HNO_3$/acetic acid (HAc) and silver nitrate ($AgNO_3$), a mixture of $HNO_3$ and tartaric acid, ammonium persulfate, and combinations thereof.

In other features, exposing the substrate to the third wet chemistry includes exposing the substrate to chemistry selected from a group consisting of hydrogen peroxide ($H_2O_2$), a mixture of hydrochloric acid (HCl) and hydrogen peroxide ($H_2O_2$), a mixture of HCl and nitric acid ($HNO_3$), $HNO_3$, a mixture of hydrofluoric acid, nitric acid and tartaric acid, a mixture of hydrofluoric acid, nitric acid and acetic acid, and combinations thereof.

In other features, the second layer includes the material and one or more other materials, and wherein the material is greater than or equal to 50% by weight of the second layer. The first layer includes germanium and the second layer includes silicon germanium. The germanium in the second layer comprises greater than or equal to 50% by weight of the second layer. The first layer includes silicon germanium and the second layer includes silicon.

A method for patterning a substrate including multiple layers using a sulfur-based mask includes a) providing a substrate including a first layer and a second layer arranged on the first layer. The first layer includes a material selected from a group consisting of germanium, silicon germanium and type III/V materials. The second layer includes the material and one or more other materials. The material is greater than or equal to 50% by weight of the second layer. The method includes b) cleaning the substrate; c) enhancing a surface of the substrate to increase bonding of a mask layer; d) depositing the mask layer including a sulfur species onto sidewalls of the first layer and the second layer by exposing the substrate to a first wet chemistry; e) removing the mask layer on the sidewalls of the second layer while not removing the mask layer on the sidewalls of the first layer by exposing the substrate to a second wet chemistry; f) selectively etching the second layer relative to the first layer by exposing the substrate to a third wet chemistry; and g) repeating d), e) and f) one or more times.

In other features, b) includes exposing the substrate to a mixture including deionized water (DIW), aqueous hydrochloric acid (HCl) and aqueous hydrogen peroxide ($H_2O_2$) at a predetermined temperature for a predetermined period.

In other features, b) includes exposing the substrate to dilute hydrofluoric acid (HF).

In other features, c) includes exposing the substrate to chemistry selected from a group consisting of dilute hydrogen chloride (HCl), dilute hydrogen bromide (HBr), and dilute hydrogen iodide (HI), and combinations thereof. The first wet chemistry is selected from a group including ammonium sulfide $(NH_4)_2S$, elemental sulfur (S), alkanethiols, and combinations thereof. The second wet chemistry is selected from a group including a mixture of hydrofluoric acid (HF) and hydrogen peroxide ($H_2O_2$), ammonia ($NH_3$), potassium hydroxide (KOH), tetramethylammonium hydroxide (TMAH), tetraethylammonium hydroxide (TEAH), chlorine, sodium peroxide ($Na_2O_2$), sodium hypochlorite (NaClO), ozone ($O_3$), potassium cyanide (KCN), a mixture of potassium hydroxide (KOH), potassium ferricyanide $K_3Fe(CN)_6$ and water ($H_2O$), a mixture of hydrofluoric acid and nitric acid ($HF/HNO_3$), a mixture of citric acid and $H_2O_2$, a mixture of $HF/HNO_3$/acetic acid (HAc) and silver nitrate ($AgNO_3$), a mixture of $HNO_3$ and tartaric acid, ammonium persulfate, and combinations thereof.

In other features, the third wet chemistry is selected from a group consisting of hydrogen peroxide ($H_2O_2$), a mixture of hydrochloric acid (HCl) and hydrogen peroxide ($H_2O_2$), a mixture of HCl and nitric acid ($HNO_3$), $HNO_3$, a mixture of hydrofluoric acid, nitric acid and tartaric acid, a mixture of hydrofluoric acid, nitric acid and acetic acid, and combinations thereof.

In other features, the first layer includes germanium and the second layer includes silicon germanium. The first layer includes silicon germanium and the second layer includes silicon.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

The present disclosure involves a masking approach using sulfur (S) film to protect a first layer (such as Ge or SiGe) to enable the patterning of a second film (such as SiGe or Si film, respectively). The method for selective patterning according to the present disclosure is based on a process including surface enhancement, masking, partial mask removal, and selective etch. Wet chemistries are disclosed for surface enhancement, masking, partial mask removal, and selective etch. Multiple cycles can be performed to increase the effect of passivation of the first film and etching of the second film.

A method according to the present disclosure allows selective patterning of materials using cyclic wet chemistry. While the foregoing describes a specific example using Ge film for the first layer and SiGe film for the second layer, the first layer may include a material such as SiGe, gallium (Ga), arsenic (As), indium (In) and other type III/V materials. The second layer may include the material in the first layer in combination with one or more other materials. For example, the one or more other materials may include silicon (Si). Alternately, the second layer may include Si film.

In some examples, the material comprises greater than or equal to 50% of the second layer. In some examples, the first layer includes Ge film and the second layer includes SiGe film (the SiGe film has the same or higher concentrations of Ge relative to Si). In some examples, the concentration of Ge is in a range between 50 to 75% in the SiGe film. In other examples, the second layer does not include type III/V materials. For example, the second layer can include Si film or other materials.

As previously described above, it is relatively difficult to pattern the SiGe film (having high Ge content) with high selectivity relative to the Ge film because the two materials have very little contrast with respect to chemical properties and etch rates. Typically the etch rate scales with the percentage of Ge.

Figure 1:
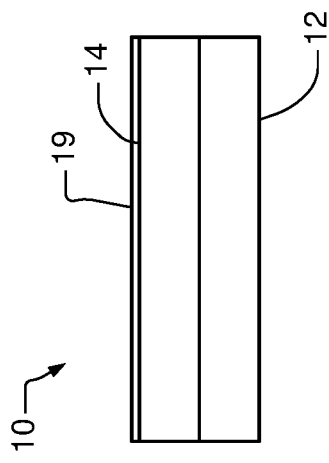
FIGS. 1-2 show cross-sectional views of an example of a substrate including a first layer and a second layer during native oxide removal and cleaning, respectively.
Figure 2:
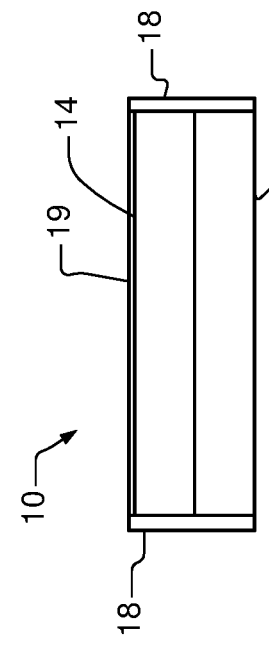

Referring now to FIGS. 1 and 2, a substrate 10 includes a first layer 12 and a second layer 14 arranged on the first layer 12. In some examples, the first layer 12 includes Ge film and the second layer 14 includes SiGe film. In some examples, the first layer 12 includes SiGe film and the second layer 14 includes Si film. Sidewall oxide 18 may be located on sidewalls of the first layer 12 and the second layer 14. In some examples, the sidewall oxide 18 comprises fins. In FIG. 1, the sidewall oxide 18 may be etched or otherwise removed. In some examples, a mask layer 19 is arranged on a top surface of the second layer 14 to protect the top surface of the substrate. In some examples, the mask layer 19 may be made of nitride, oxide or carbon-based oxide.

In FIG. 2, a clean process may be performed on the substrate 10 to remove etch by-products, passivation layers, and/or encapsulation layers. In some examples, the substrate is exposed to a clean process using dilute hydrofluoric acid (HF) or standard clean 2 (SC2) may be performed to remove the etch by-products without attacking the Ge/SiGe bulk material. In some examples, SC2 is performed using a mixture including deionized water (DIW), aqueous hydrochloric acid (HCl) and aqueous hydrogen peroxide ($H_2O_2$) at a predetermined substrate temperature for a predetermined period. In some examples, the temperature is in a range from 20° C. to 50° C. and the predetermined period is in a range of 60 s to 300 s. In some examples, the aqueous HCl is 30% to 50% by weight and the aqueous $H_2O_2$ is 20% to 40% by weight, although other values may be used. In some examples, the SC2 treatment includes 4000-6000 parts DIW, 1 part aqueous HCl, and 5-20 parts aqueous $H_2O_2$.

Figure 3:
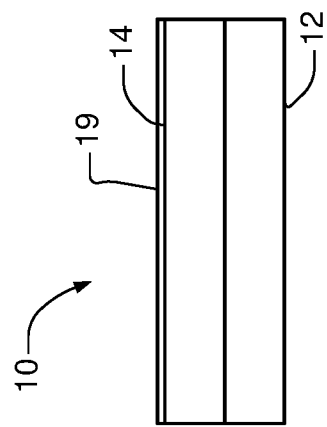
FIG. 3 shows a cross-sectional view of the substrate of FIGS. 1-2 during surface enhancement for subsequent bonding to sulfur species.

Referring now to FIG. 3, the first layer 12 and the second layer 14 are treated with surface enhancement chemistry to enhance exposed sidewall surfaces to allow subsequent bonding of a sulfur mask species. For example, the chemistry and process conditions are selected to remove native oxide. For example, the chemistry and process conditions are selected to remove Ge oxides without attacking Ge. In some examples, the wet chemistry is selected from a group consisting of dilute hydrogen chloride (HCl), dilute hydrogen bromide (HBr), and dilute hydrogen iodide (HI). In some examples, the dHCl has a concentration of 0.01%-10% w, although other concentrations may be used.

Figure 4:
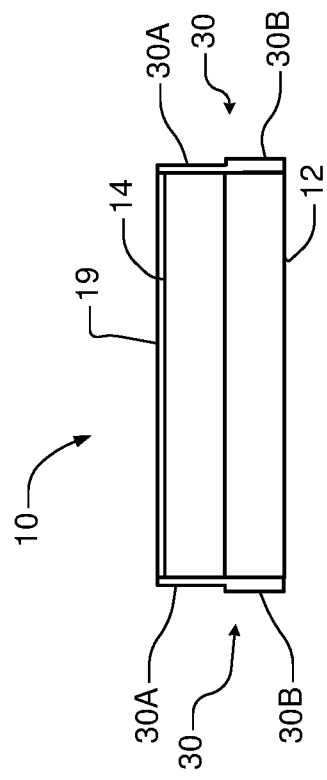
FIG. 4 shows a cross-sectional view of the substrate of FIG. 3 after deposition of a sulfur mask layer.

Referring now to FIG. 4, a mask layer 30 is deposited on sidewalls of the first layer 12 and the second layer 14. In some examples, the mask layer 30 includes sulfur and is deposited using wet chemistry. The strength and thickness of sulfur bonds is a function of the concentration of Ge or other type III/V material in the corresponding layer and the chemistry of the solution. Therefore, the sulfur bonds are stronger and thicker on the first layer as compared to the second layer since the concentration of Ge is higher in the first layer relative to the second layer.

The mask layer 30 is tuned to bond to a greater extent with the first layer 12 (e.g. the Ge film) (as shown at portion 30B) and to a lesser extent to the second layer 14 (e.g. the SiGe film) (as shown at 30A). The wet chemistry and process conditions effectively passivate the first layer 12 during etching that occurs in subsequent steps. In some examples, the wet chemistry is selected from a group including ammonium sulfide $(NH_4)_2S$, elemental sulfur (S), alkane-thiols and combinations thereof.

Figure 5:
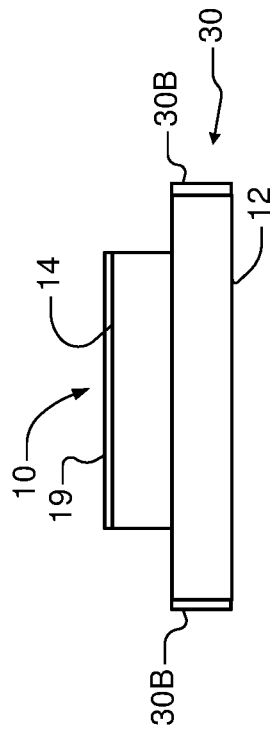
FIG. 5 shows a cross-sectional view of the substrate of FIG. 4 during removal of portions of the mask layer on the second layer while leaving other portions on the first layer for passivation of the first layer.

Referring now to FIG. 5, the substrate 10 is exposed to wet chemistry to remove portions 30A of the mask layer 30 on the second layer 14. More particularly, the wet chemistry removes the portions 30A of the mask layer 30 on the second layer 14 (e.g. SiGe) while leaving other portions of the mask layer 30 on the first layer 12 (e.g. Ge) to allow passivation during subsequent steps. In other words, the wet chemistry that is applied to the mask layer 30 (arranged over both the first layer 12 and the second layer 14) performs mask removal of the portion 30A of the mask layer 30 arranged over the second layer 14 but the portion 30B of the mask layer 30 is not completely removed since it is thicker. In other words, the mask removal of the portion 30A may be due to the lower bond strength and thickness of the portion 30A relative to the portion 30B.

In some examples, the substrate is exposed to the wet chemistry selected from a group including dilute hydrofluoric acid (dHF) and dilute hydrogen peroxide ($dH_2O_2$), dilute ammonia ($dNH_3$), dilute potassium hydroxide (dKOH), dilute tetramethylammonium hydroxide (TMAH), dilute tetraethylammonium hydroxide (dTEAH), dilute chlorine, sodium peroxide ($Na_2O_2$), sodium hypochlorite (NaClO), ozone ($O_3$), potassium cyanide (KCN), a mixture of potassium hydroxide (KOH), potassium ferricyanide $K_3Fe(CN)_6$ and water ($H_2O$), a mixture of hydrofluoric acid and nitric acid ($HF/HNO_3$), a mixture citric acid and $H_2O_2$, a mixture of HF, $HNO_3$, acetic acid and silver nitrate ($AgNO_3$), a mixture of $HNO_3$ and tartaric acid, ammonium persulfate, and combinations thereof.

Figure 6:
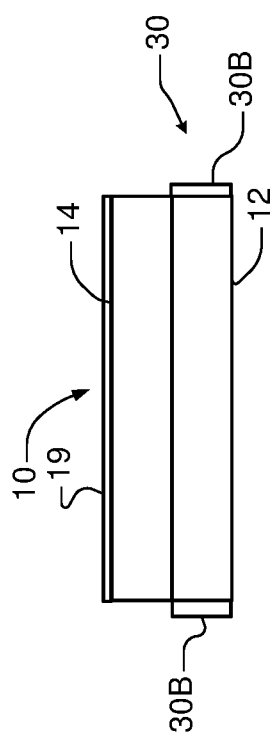
FIG. 6 shows a cross-sectional view of the substrate of FIG. 5 during selective etching of the first layer.

Referring now to FIG. 6, the substrate is exposed to wet chemistry to selectively etch the second layer 14 (e.g. the SiGe film) without attacking the mask layer 30 remaining on the first layer 12. As a result, the second layer 14 is selectively etched at a higher rate than the first layer 12 (e.g. the Ge film). In some examples, the chemistry is selected from a group consisting of $dH_2O_2$, a mixture of HCl and $H_2O_2$, a mixture of HCl and $HNO_3$, $dHNO_3$, a mixture of HF, $HNO_3$ and tartaric acid, a mixture of HF, $HNO_3$, and HAc, and combinations thereof. In some examples, the etch ratio of the second layer 14 relative to the first layer 12 is greater than or equal to 5:1. In some examples, the etch ratio of the second layer 14 relative to the first layer 12 is greater than or equal to 10:1.

The process shown in FIGS. 3-6 can be performed one or more times or cycled as needed. It is expected that the foregoing process will also work for other semiconductor materials which can form a metal-sulfur (M-S) bond such as Ga, As, and In. For SiGe/Ge, each cycle etches 5 to 30 Å of the SiGe film with a selectivity ratio of 10:1 with respect to the Ge film.

Figure 7:
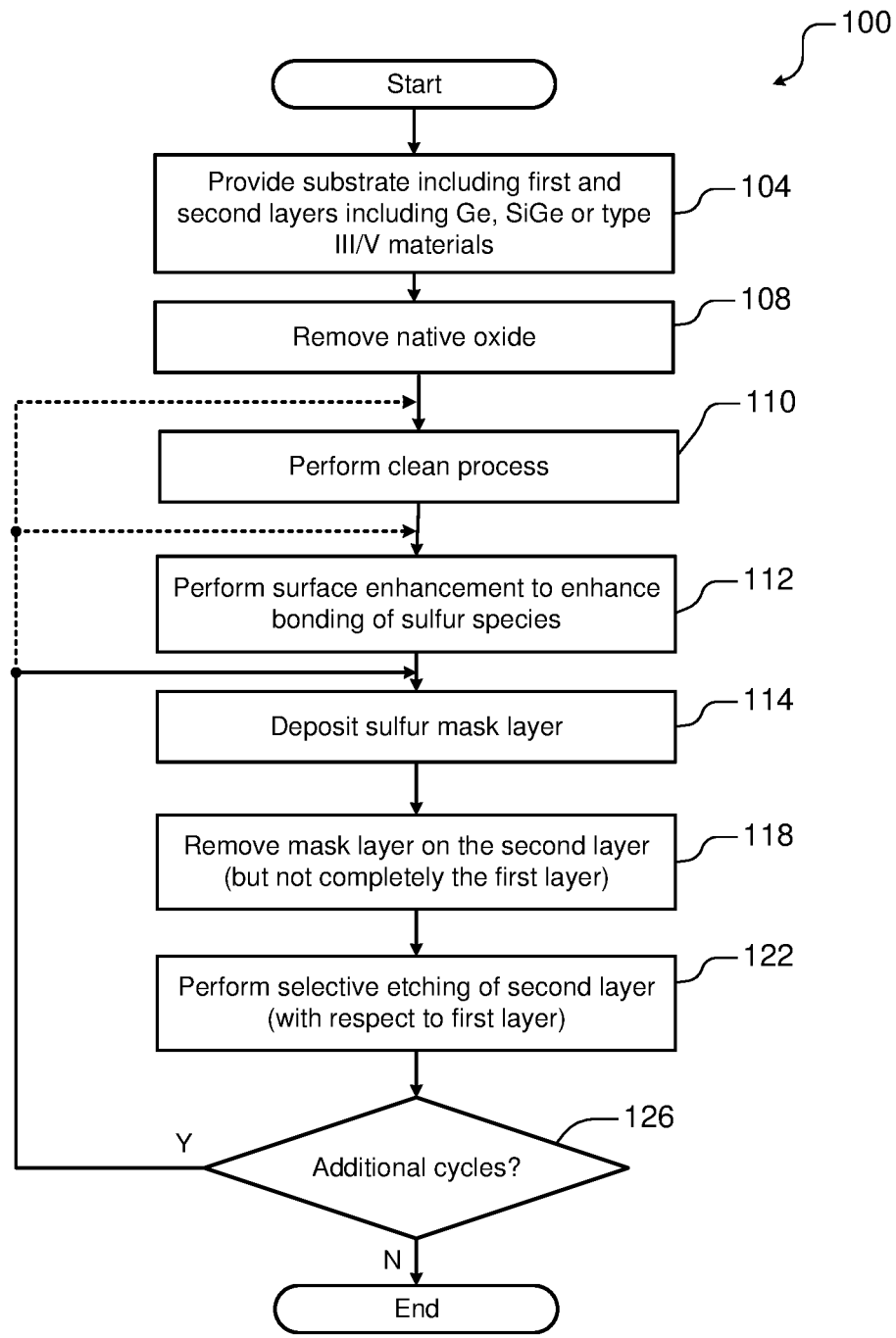
FIG. 7 illustrates a method for selectively etching a first layer of a substrate relative to a second layer of the substrate.

Referring now to FIG. 7, a method 100 for selective self-aligned patterning of materials using a sulfur-containing mask is shown. At 104, a substrate is provided that includes first and second layers. In some examples, the first layer includes a material selected from a group including germanium (Ge), silicon germanium (SiGe), and type III/V materials. In some examples, the second layer includes the material and one or more other materials. In other examples, the second layer does not include the material. In other examples, the second layer includes Si.

At 108, a native oxide layer is removed. At 110, the clean process is performed. At 112, the surface enhancement process is performed to improve bonding of the sulfur mask. At 114, the sulfur mask layer is deposited. At 118, portion of the mask layer are removed from the second layer while allowing the other portion of the mask layer (sufficient for passivation) to remain on the first layer. In some examples, the etch rate of the portion on the first layer is similar to the etch rate of portions of the second layer. However, the mask portion on the second layer is thinner and is removed prior to removal of the entire mask portion on the first layer.

At 122, selective etching of the second layer is performed relative to the first layer. At 126, the method determines whether additional cycles should be performed. If 126 is true, the method continues with 110, 112 or 114. Otherwise, the method ends.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for patterning a substrate including multiple layers using a sulfur-based mask, comprising:
   a) providing a substrate including a first layer and a second layer arranged on the first layer, wherein the first layer includes a material selected from the group consisting of germanium, silicon germanium and type III/V materials;
   b) depositing a mask layer including sulfur species on sidewalls of the first layer and the second layer by exposing the substrate to a first wet chemistry; and
   c) removing the mask layer on the sidewalls of the second layer while not completely removing the mask layer on the sidewalls of the first layer by exposing the substrate to a second wet chemistry.

2. The method of claim 1, further comprising:
   d) etching the second layer relative to the first layer and the mask layer on the sidewalls of the first layer by exposing the substrate to a third wet chemistry.

3. The method of claim 2, further comprising repeating b), c) and d) one or more times.

4. The method of claim 2, further comprising:
   e) performing a clean process prior to b).

5. The method of claim 4, wherein the clean process includes exposing the substrate to a mixture including deionized water (DIW), aqueous hydrochloric acid (HCl) and aqueous hydrogen peroxide ($H_2O_2$) at a predetermined temperature for a predetermined period.

6. The method of claim 4, wherein the clean process includes exposing the substrate to dilute hydrofluoric acid (HF).

7. The method of claim 4, further comprising:
   f) enhancing a surface of the substrate by exposing the substrate to a fourth wet chemistry to increase bonding of the mask layer before b).

8. The method of claim 7, further comprising repeating f), b), c) and d) one or more times.

9. The method of claim 7, wherein exposing the substrate to the fourth wet chemistry includes exposing the substrate to chemistry selected from the group consisting of dilute hydrogen chloride (HCl), dilute hydrogen bromide (HBr), dilute hydrogen iodide (HI), and combinations thereof.

10. The method of claim 1, wherein exposing the substrate to the first wet chemistry includes exposing the substrate to chemistry selected from the group including ammonium sulfide $(NH_4)_2S$, elemental sulfur (S), alkane-thiols, and combinations thereof.

11. The method of claim 1, wherein exposing the substrate to the second wet chemistry includes exposing the substrate to chemistry selected from the group including a mixture of hydrofluoric acid (HF) and hydrogen peroxide ($H_2O_2$), ammonia ($NH_3$), potassium hydroxide (KOH), tetramethylammonium hydroxide (TMAH), tetraethylammonium hydroxide (TEAH), chlorine, sodium peroxide ($Na_2O_2$), sodium hypochlorite (NaClO), ozone ($O_3$), potassium cyanide (KCN), a mixture of potassium hydroxide (KOH), potassium ferricyanide $K_3Fe(CN)_6$ and water ($H_2O$), a mixture of hydrofluoric acid and nitric acid ($HF/HNO_3$), a mixture of citric acid and $H_2O_2$, a mixture of $HF/HNO_3$/acetic acid (HAc) and silver nitrate ($AgNO_3$), a mixture of $HNO_3$ and tartaric acid, ammonium persulfate, and combinations thereof.

12. The method of claim 2, wherein exposing the substrate to the third wet chemistry includes exposing the substrate to chemistry selected from the group consisting of hydrogen peroxide ($H_2O_2$), a mixture of hydrochloric acid (HCl) and hydrogen peroxide ($H_2O_2$), a mixture of HCl and nitric acid ($HNO_3$), $HNO_3$, a mixture of hydrofluoric acid, nitric acid and tartaric acid, a mixture of hydrofluoric acid, nitric acid and acetic acid, and combinations thereof.

13. The method of claim 1, wherein the second layer includes the material and one or more other materials, and wherein the material is greater than or equal to 50% by weight of the second layer.

14. The method of claim 1, wherein the first layer includes germanium and the second layer includes silicon germanium.

15. The method of claim 14, wherein the germanium in the second layer comprises greater than or equal to 50% by weight of the second layer.

16. The method of claim 1, wherein the first layer includes silicon germanium and the second layer includes silicon.

17. A method for patterning a substrate including multiple layers using a sulfur-based mask, comprising:
   a) providing a substrate including a first layer and a second layer arranged on the first layer, the first layer including a material selected from the group consisting of germanium, silicon germanium and type III/V materials, the second layer including the material and one or more other materials, and the material is greater than or equal to 50% by weight of the second layer;
   b) cleaning the substrate;
   c) enhancing a surface of the substrate to increase bonding of a mask layer;
   d) depositing the mask layer including a sulfur species onto sidewalls of the first layer and the second layer by exposing the substrate to a first wet chemistry; and
   e) removing the mask layer on the sidewalls of the second layer while not completely removing the mask layer on the sidewalls of the first layer by exposing the substrate to a second wet chemistry.

18. The method of claim 17, further comprising:
   f) etching the second layer relative to the first layer by exposing the substrate to a third wet chemistry; and
   g) repeating d), e) and f) one or more times.

19. The method of claim 17, wherein b) includes exposing the substrate to a mixture including deionized water (DIW), aqueous hydrochloric acid (HCl) and aqueous hydrogen peroxide ($H_2O_2$) at a predetermined temperature for a predetermined period.

20. The method of claim 19, wherein b) includes exposing the substrate to dilute hydrofluoric acid (HF).

21. The method of claim 19, wherein c) includes exposing the substrate to chemistry selected from the group consisting of dilute hydrogen chloride (HCl), dilute hydrogen bromide (HBr), and dilute hydrogen iodide (HI), and combinations thereof.

22. The method of claim 19, wherein the first wet chemistry is selected from the group including ammonium sulfide $(NH_4)_2S$, elemental sulfur (S), alkane-thiols, and combinations thereof.

23. The method of claim 19, wherein the second wet chemistry is selected from the group including a mixture of hydrofluoric acid (HF) and hydrogen peroxide ($H_2O_2$), ammonia ($NH_3$), potassium hydroxide (KOH), tetramethylammonium hydroxide (TMAH), tetraethylammonium hydroxide (TEAH), chlorine, sodium peroxide ($Na_2O_2$), sodium hypochlorite (NaClO), ozone ($O_3$), potassium cyanide (KCN), a mixture of potassium hydroxide (KOH), potassium ferricyanide $K_3Fe(CN)_6$ and water ($H_2O$), a mixture of hydrofluoric acid and nitric acid (HF/$HNO_3$), a mixture of citric acid and $H_2O_2$, a mixture of HF/$HNO_3$/ acetic acid (HAc) and silver nitrate ($AgNO_3$), a mixture of $HNO_3$ and tartaric acid, ammonium persulfate, and combinations thereof.

24. The method of claim 18, wherein the third wet chemistry is selected from the group consisting of hydrogen peroxide ($H_2O_2$), a mixture of hydrochloric acid (HCl) and hydrogen peroxide ($H_2O_2$), a mixture of HCl and nitric acid ($HNO_3$), $HNO_3$, a mixture of hydrofluoric acid, nitric acid and tartaric acid, a mixture of hydrofluoric acid, nitric acid and acetic acid, and combinations thereof.

25. The method of claim 19, wherein the first layer includes germanium and the second layer includes silicon germanium.

26. The method of claim 19, wherein the first layer includes silicon germanium and the second layer includes silicon.

* * * * *